United States Patent
Suzuki et al.

(10) Patent No.: US 6,750,472 B2
(45) Date of Patent: Jun. 15, 2004

(54) ORGANIC ELECTROLUMINESCENT DEVICE

(75) Inventors: Harumi Suzuki, Kariya (JP); Tetsuya Kato, Anjo (JP)

(73) Assignee: Denso Corporation, Kariya (JP)

( * ) Notice: Subject to any disclaimer, the term of this patent is extended or adjusted under 35 U.S.C. 154(b) by 103 days.

(21) Appl. No.: 10/227,458

(22) Filed: Aug. 26, 2002

(65) Prior Publication Data

US 2003/0038287 A1 Feb. 27, 2003

(30) Foreign Application Priority Data

Aug. 27, 2001 (JP) ........................................ 2001-256144
May 28, 2002 (JP) ........................................ 2002-154102

(51) Int. Cl.⁷ ............................. H01J 1/62; H01L 51/00
(52) U.S. Cl. ..................... 257/40; 257/102; 313/504; 313/506
(58) Field of Search ...................... 257/40, 102, 103; 313/498, 504, 506

(56) References Cited

U.S. PATENT DOCUMENTS 5,294,810 A   3/1994   Egusa et al. ................. 257/40
6,447,934 B1   9/2002   Suzuki ......................... 313/504

FOREIGN PATENT DOCUMENTS

EP   0 857 007 A1   8/1998

*Primary Examiner*—Minhloan Tran
(74) *Attorney, Agent, or Firm*—Posz & Bethards, PLC

(57) ABSTRACT

An organic electroluminescent device includes an anode, a cathode, a hole injection layer, a hole transport layer, an electron capture layer, a luminescent layer, and an electron transport layer. The five layers are sequentially stuck in the above order between the anode and the cathode in the direction toward the cathode. The luminescent layer includes a host organic material, the luminescent spectrum of which has a peak between 380 nm and 510 nm, and a guest fluorescent dye. The hole injection layer and the hole transport layer respectively include a host organic material. The lowest energy level in the conduction band of the host organic material of the electron capture layer is lower than those of the hole transport layer and the luminescent layer. Therefore, the device can emit light including blue light component while the host organic material of the hole transport layer is prevented from deteriorating.

14 Claims, 7 Drawing Sheets

DCJTB

BAIq

ORGANIC ELECTROLUMINESCENT DEVICE

CROSS REFERENCE TO RELATED APPLICATION

This application is based on and incorporates herein by reference Japanese Patent Applications No. 2001-256144 filed on Aug. 27, 2001 and No. 2002-154102 filed on May 28, 2002.

BACKGROUND OF THE INVENTION

The present invention relates to an organic electroluminescent device, in which a plurality of organic material layers is located between an anode and a cathode. Specifically, the device includes an organic luminescent layer that emits blue light, and the device efficiently and stably emits light including the blue light as a light component.

An organic electroluminescent device (organic EL device) has relatively high luminance and wide viewing angle because of its own luminescence. In addition, the organic EL device can operate with a few to dozens of voltages, so the power unit and so on for the device can be lightened. Therefore, the organic EL device is preferably applied to flat panel displays, illumination apparatuses, backlights, and so on.

The EL device includes an anode, a cathode, and a plurality of organic material layers, which is located between the anode and the cathode. In general, the organic material layers include a hole transport layer, a luminescent layer, and a electron transport layer, and the layers are located in this order between the anode and the cathode in the direction toward the cathode. Holes are injected into the luminescent layer from the anode through the hole transport layer, and electrons are injected into the luminescent layer from the cathode through the electron transport layer. The holes and electrons recombine in the luminescent layer to generate energy, with which a luminescent material in the luminescent layer emits light.

The organic EL device of this type enables luminescence of a variety of colors by combining luminescent materials that have a different luminescent spectrum. For example, colors between green and red are provided by adding a luminescent material to another luminescent material that emits green light such as an aluminum chelate. However, there is the following problem with an organic EL device that emits light including blue light component.

The luminescent layer of the organic EL device includes a host organic material, the luminescent spectrum of which has a peak between 380 nm and 510 nm, to emit blue light. In general, the hole transport layer, which is closer to the anode than the luminescent layer is, has a relatively great energy gap. However, the luminescent layer also has a relatively great energy gap, so the energy hurdle between the layers is low enough for electrons, which are injected from the cathode into the luminescent layer, to drain into the hole transport layer.

The electrons that have drained into the hole transport layer excite a host organic material of the hole transport layer, which is made of e.g., amine-based material. The host organic material can not stably maintain the excited state, so the host organic material gradually deteriorates. As a result, the luminance of the organic EL device that emits light including blue light component is lowered at an unfavorably high rate.

A method to address the above problem is to add a guest fluorescent dye to the host organic material of the hole transport layer to prevent the excitation of the host organic material by permitting the guest fluorescent dye to emit light. For example, an organic EL device disclosed in JP-A-2000-182768, which emits light including blue light component, has a structure of this type. According to the above method, the deterioration of the host organic material of the hole transport layer is prevented to some degree. However, the method can not completely prevent the injection of electrons into the host organic material of the hole transport layer.

Alternatively, a method to prevent the injection of electrons into the host organic material of the hole transport layer is to adjust the relation in the energy gap between the organic material layers to make the luminescent layer serve as a potential well. For example, an organic EL device disclosed in JP-A-3-230583 has a structure of this type. Incidentally, it is known that color mixture luminescence is realized by forming two potential wells in an organic EL device of this type. According to the above method, it is possible to prevent the injection of electrons by trapping electrons in the potential well. However, in an organic EL device of this type, the energy gap of the luminescent layer is bound to be so narrow that the luminescent layer can not emit blue light, the energy of which is greater than the energy gap, even though the luminescent layer can emit light having wavelengths longer than that corresponding to green light.

SUMMARY OF THE INVENTION

The present invention has been made in view of the above aspects with an object to provide an organic electroluminescent device that includes an anode, a cathode, and a plurality of organic material layers including a hole transport layer, which are located between the electrodes, and efficiently and stably emits light including blue light component while a host organic material of the hole transport layer is prevented from deteriorating.

In an organic EL device according to the present invention, an organic EL device includes an anode, a cathode, a hole injection layer, a hole transport layer, an electron capture layer, a luminescent layer, and an electron transport layer. The five layers are sequentially stuck in the above order between the anode and the cathode in the direction toward the cathode. The luminescent layer includes a host organic material, the luminescent spectrum of which has a peak between 380 nm and 510 nm, and a guest fluorescent dye. The lowest energy level in the conduction band of the host organic material of the electron capture layer is lower than those of the hole transport layer and the luminescent layer, between which the electron capture layer is located.

Therefore, electrons, which are injected from the cathode into the luminescent layer and otherwise drain into the hole transport layer, are captured by the electron capture layer. Thus, the organic EL device preferably efficiently and stably emits light including blue light component while a host organic material of the hole transport layer is prevented from deteriorating.

Another organic EL device according to the present invention includes an anode, a cathode, a hole injection layer, a hole transport layer, a luminescent layer, and an electron transport layer. The four organic layers are sequentially stuck in the above order between the anode and the cathode in the direction toward the cathode. The organic EL device has no electron capture layer. Instead, the hole transport layer has the same function as the electron capture layer. That is, the hole transport layer includes a dopant, which is not fluorescent and the lowest energy level in the conduction band of which is lower than that of a host organic material of the luminescent layer. Therefore, electrons, which are injected from the cathode into the luminescent layer and drain into the hole transport layer, are captured by the dopant. Thus, the dopant prevents electrons from being injected to a host organic material of the hole transport layer, and prevents the host organic material from being excited by electrons. As a result, the organic EL device preferably efficiently and stably emits blue light while the host organic material of the hole transport layer is prevented from deteriorating Other organic EL device according to the present invention includes an anode, a cathode, a hole injection layer, a hole transport layer, a first luminescent layer, a second luminescent layer, and an electron transport layer. The five layers are sequentially stuck in the above order between the anode and the cathode in the direction toward the cathode. Each luminescent layer includes a host organic material and a guest fluorescent dye. The host organic material of the second luminescent layer includes a first electron transport material, which transports electrons, and the luminescent spectrum of which has a peak between 380 nm and 510 nm. The host organic material of first the luminescent layer includes a hole transport material and a second electron transport material. The hole transport material transports holes, and has a luminescent spectrum that has a peak between 380 nm and 510 nm. The second electron transport material transports electrons, and the lowest energy level in the conduction band of the second electron transport material is lower than that of the first electron transport material.

Therefore, electrons injected from the cathode 40 into the first luminescent layer 33a through the second luminescent layer 33b are trapped by the second electron transport material. Electrons trapped by the second electron transport material are consumed in light emission of the guest fluorescent dye in the first luminescent layer, so electrons injected from the cathode is prevented from draining into the hole transport layer. Therefore, the host organic material of the hole transport layer is prevented from being excited by electrons. As a result, the organic EL device preferably efficiently and stably emits light including blue color while the host organic material of the hole transport layer is prevented from deteriorating.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

The present invention will be described in detail with reference to various embodiments.

First Embodiment

Figure 1:
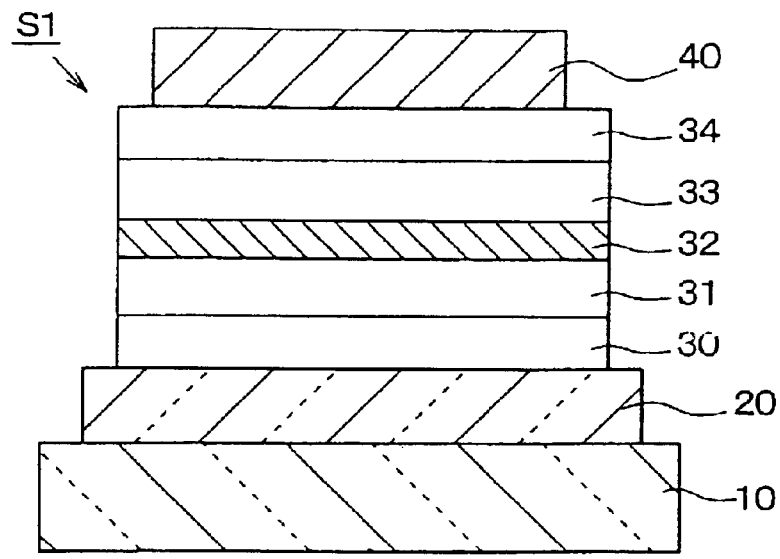
FIG. 1 is a schematic cross-sectional view of the organic EL device according to a first embodiment of the present invention.

As shown in FIG. 1, an organic EL device S1 according to a first embodiment includes a substrate 10, an anode 20, a cathode 40, and a plurality of organic layers 30–34. Each electrode 20, 40 is made of a transparent conductive film, and the organic layers 30–34 are located between the electrodes 20, 40. The electrodes 20, 40 and the organic layers 30–34 are formed on the substrate 10 by high-vacuum thermal sublimation technique in a known manner. The organic layers 30–34 are a hole injection layer 30, a hole transport layer 31, an electron capture layer 32, a luminescent layer 33, and an electron transport layer 34. The five organic layers 30–34 are sequentially stuck in the above order between the anode 20 and the cathode 40 in the direction toward the cathode 40. When a predetermined voltage is applied between the anode 20 and the cathode 40, the luminescent layer 33 emits blue light.

It is preferred that the hole transport layer 31 include a host organic material, the luminescent spectrum of which has a peak between 380 nm and 510 nm such that the material emits blue light. The luminescent layer 33 includes a host organic material, the luminescent spectrum of which has a peak between 380 nm and 510 nm such that the material emits blue light, and a guest fluorescent dye. The electron capture layer 32 includes a host organic material, the luminescent spectrum of which typically has a peak at a wavelength longer than 510 nm. In other words, the peak is typically located at a wavelength longer than the wavelength range corresponding to blue light, and the host organic material emits light between green light and red light.

Figure 2:
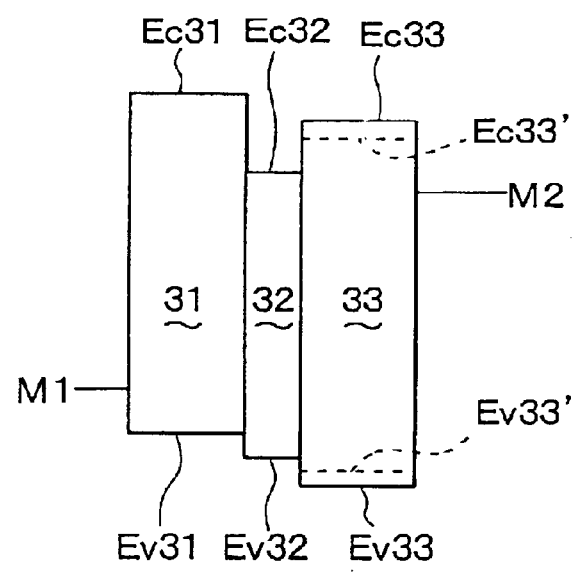
FIG. 2 is a typical energy band chart of the hole transport layer, the electron capture layer, and the luminescent layer in the organic EL device according to the first embodiment.

In the organic EL device S1 in FIG. 1, the relation in the energy gap between the host organic materials of the hole transport layer 31, the electron capture layer 32, and the luminescent layer 33 are set as shown in FIG. 2. In FIG. 2, M1 and M2 denote the work functions of the anode 20 and the cathode 40, respectively. Energy levels Ec31, Ec32, and Ec33 are the lowest energy levels in the conduction bands of the host organic materials of the hole transport layer 31, the electron capture layer 32, and the luminescent layer 33, respectively. Energy levels Ev31, Ev32, and Ev33 are the highest energy levels in the valence bands of the host organic materials of the hole transport layer 31, the electron capture layer 32, and the luminescent layer 33, respectively. Energy levels Ec33' and Ev33' are the lowest energy level in the conduction band and the highest energy level in the valence band of the guest fluorescent dye, which is included in the luminescent layer 33.

As shown in FIG. 2, the energy level Ec32 of the electron capture layer 32 is lower than the energy levels Ec31 and Ec33 of the hole transport layer 31 and the luminescent layer 33, between which the electron capture layer 32 is located. Therefore, electrons, which are injected from the cathode 40 into the luminescent layer 33 and otherwise drain into the hole transport layer 31, are captured by the electron capture layer 32.

The host organic material of the luminescent layer 33 has a wide energy gap enough to emit blue light, and the energy gap is so wide that it is possible to add the guest fluorescent dye, which emits blue light, to the luminescent layer 33. By adding the guest fluorescent dye to the luminescent layer 33, it is possible to permit the luminescent layer 33 to emit blue light although the host organic material of the electron capture layer 32 has a relatively narrow energy gap to satisfy the above-described relation between the energy levels Ec31, Ec32, and Ec33, in other words, although the luminescent spectrum of the host organic material has a peak at a wavelength longer than the wavelength range corresponding to blue light to emit light between green light and red light. Electrons injected from the cathode 40 are trapped by the guest fluorescent dye in the luminescent layer 33, and holes injected from the anode 20 drain into the guest fluorescent dye of the luminescent layer 33 clearing energy hurdles between the energy levels Ev31, Ev32, and Ev33'. Electrons trapped by the guest fluorescent dye and holes recombine to permit the guest fluorescent dye to emit blue light in the luminescent layer 33.

As described above, blue light is emitted from the luminescent layer 33 while the injection of electrons into the host organic material of the hole transport layer 31 is preferably prevented, so the organic EL device S1 in FIG. 1 preferably efficiently and stably emits light including blue light component while the host organic material of the hole transport layer 31 is prevented from deteriorating. The electron capture layer 32 may also include a guest fluorescent dye. The electron capture layer 32 further efficiently traps electrons by adding the guest fluorescent dye, and the color of light emitted from the organic EL device S1 is diversified by combining light emissions from the guest fluorescent dye added to the electron capture layer 32 and the one in the luminescent layer 33.

In the organic EL device S1 in FIG. 1, the host organic materials of the hole transport layer 31 and the luminescent layer 33 preferably have a relatively wide energy gap, e.g., approximately 3 eV, to satisfy the above-described relation shown in FIG. 2 between the energy levels Ec31, Ec32, and Ec33. In addition, the difference between the energy gap (Ec31-Ev31) of the host organic material of the hole transport layer 31 and the energy gap (Ec33-Ev33) of the host organic material of the luminescent layer 33 is typically approximately 0.4 eV or smaller.

It is preferred that the energy level Ec32 of the host organic material of the electron capture layer 32 be lower than the energy level Ec33 of the host organic material of the luminescent layer 33 by more than 0.1 eV in order to preferably effectively prevent the injection of electrons into the hole transport layer 31. Holes injected from the anode 20 drain into the luminescent layer 33 through the hole transport layer 31 and the electron capture layer 32, so holes are transported less effectively to the luminescent layer 33 if the electron capture layer 32 is too thick. Therefore, it is preferred that the electron capture layer 32 be thinner than the luminescent layer 33.

As described above, it is preferred that the hole transport layer 31 include a host organic material that emits blue light. However, the hole transport layer 31 may include a host organic material, the luminescent spectrum of which has a peak at a wavelength longer than the wavelength range corresponding to blue light to emit light between green light and red light, as long as the above-described relation between the energy levels Ec31, Ec32, and Ec33 are satisfied.

Figure 3:
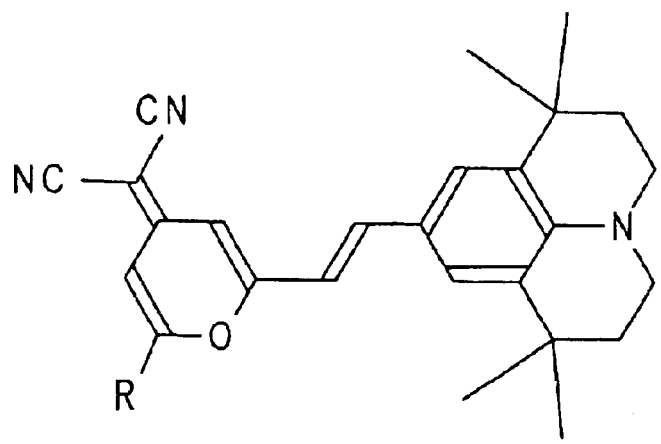
FIG. 3 is a view showing the skeleton of DCJTB.

The first embodiment will be described in detail using a couple of example devices, as follows. A first example device of the organic EL device S1 according to the first embodiment includes DCJTB, which is a guest fluorescent dye and the skeleton of which is shown in FIG. 3, in the electron capture layer 32. The first example device also includes perylene, which is a guest fluorescent dye, in the luminescent layer 33. When the first example device of the organic EL device S1 operates, DCJTB emits red light, the luminescent spectrum of which has a peak at approximately 600 nm, and at the same time, perylene emits blue light, the luminescent spectrum of which has a peak at approximately 450 nm. As a result, the first example device of the organic EL device S1 emits white light.

The first example device of the organic EL device S1, the structure of which is shown in FIG. 1, is manufactured as follows. Firstly, the anode 20, which is a transparent electrode made of indium tin oxide (ITO) and has a thickness of approximately 150 nm, is formed on a glass substrate 10 by sputtering. Other than ITO, indium zinc oxide may be used as the anode 20. The thickness of the anode 20 is preferably in a range between 100 nm and 1 $\mu$m. As shown in FIG. 1, the hole injection layer 30 is formed on the anode 20 by depositing copper phthalocyanine by a thickness of approximately 20 nm using high-vacuum thermal sublimation technique. The highest energy level Ev30 in the valence band of copper phthalocyanine is 5.3 eV. The lowest energy level Ec30 in the conduction band of copper phthalocyanine is 3.6 eV. Therefore, the energy gap of copper phthalocyanine is 1.7 eV.

Then, the hole transport layer 31 is formed on the hole injection layer 30 by depositing triphenylamine tetramer by a thickness of approximately 40 nm using high-vacuum thermal sublimation technique. The highest energy level Ev31 in the valence band of triphenylamine tetramer is 5.4 eV. The lowest energy level Ec31 in the conduction band of triphenylamine tetramer is 2.4 eV. Therefore, the energy gap of triphenylamine tetramer is 3.0 eV. The luminescent spectrum of triphenylamine tetramer has a peak at approximately 420 nm.

Subsequently, the electron capture layer 32, which includes tris(8-hydroxyquinoline)aluminum (Alq) as a host organic material and DCJTB as a guest fluorescent dye, is formed on the hole transport layer 31 by a thickness of approximately 2 nm using high-vacuum thermal sublimation technique. The electron capture layer 32 includes DCJTB at a concentration of approximately 1%. The highest energy level Ev32 in the valence band of Alq is 5.6 eV. The lowest energy level Ec32 in the conduction band of Alq is 3.1 eV. Therefore, the energy gap of Alq is 2.5 eV. The luminescent spectrum of Alq has a peak at approximately 530 nm. The highest energy level Ev32' in the valence band of DCJTB is 5.3 eV. The lowest energy level Ec32' in the conduction band of DCJTB is 3.2 eV. Therefore, the energy gap of DCJTB is 2.1 eV. The luminescent spectrum of DCJTB has a peak at approximately 600 nm.

Figure 4:
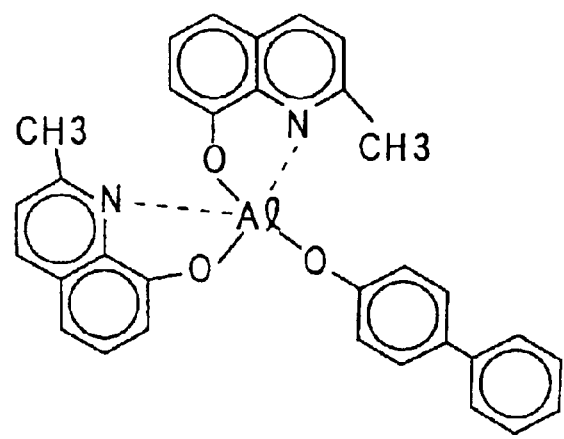
FIG. 4 is a view showing the skeleton of BAlq.

Next, the luminescent layer 33, which includes BAlq, the skeleton of which is shown in FIG. 4, as a host organic material and perylene as a guest fluorescent dye, is formed on the electron capture layer 32 by a thickness of approximately 40 nm using high-vacuum thermal sublimation technique. The luminescent layer 33 includes perylene at a concentration of approximately 1%. The highest energy level Ev33 in the valence band of BAlq is 5.8 eV. The lowest energy level Ec33 in the conduction band of BAlq is 3.0 eV. Therefore, the energy gap of Alq is 2.8 eV. The luminescent spectrum of BAlq has a peak at approximately 490 nm. The highest energy level Ev33' in the valence band of perylene is 5.5 eV. The lowest energy level Ec33' in the conduction band of perylene is 2.6 eV. Therefore, the energy gap of perylene is 2.9 eV. The luminescent spectrum of perylene has a peak at approximately 450 nm.

Then, the electron transport layer 34 is formed by depositing Alq by a thickness of approximately 20 nm using high-vacuum thermal sublimation technique. Finally, the cathode 40, which is a stack of a lithium fluoride (LiF) film and an aluminum film, is formed by depositing the lithium fluoride (LiF) film by 0.5 nm and the aluminum film by 100 nm in this order using high-vacuum thermal sublimation technique.

Figure 5:
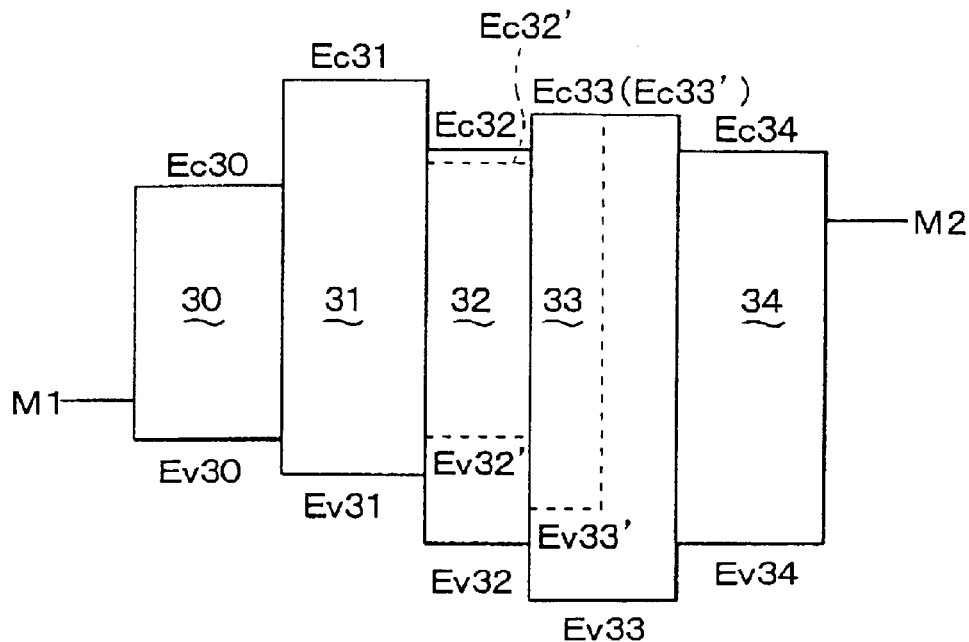
FIG. 5 is the energy band chart of the organic layers in a first example device of the organic EL device according to the first embodiment.

As shown in FIG. 5, the lowest energy level Ec32 (3.1 eV) in the conduction band of Alq, which is the host organic material of the electron capture layer 32, is lower than the lowest energy level Ec31 (2.4 eV) in the conduction band of triphenylamine tetramer, which is the host organic material of the hole transport layer 31, and the lowest energy level Ec33 (3.0 eV) in the conduction band of BAlq, which is the host organic material of the luminescent layer 33.

Figure 6:
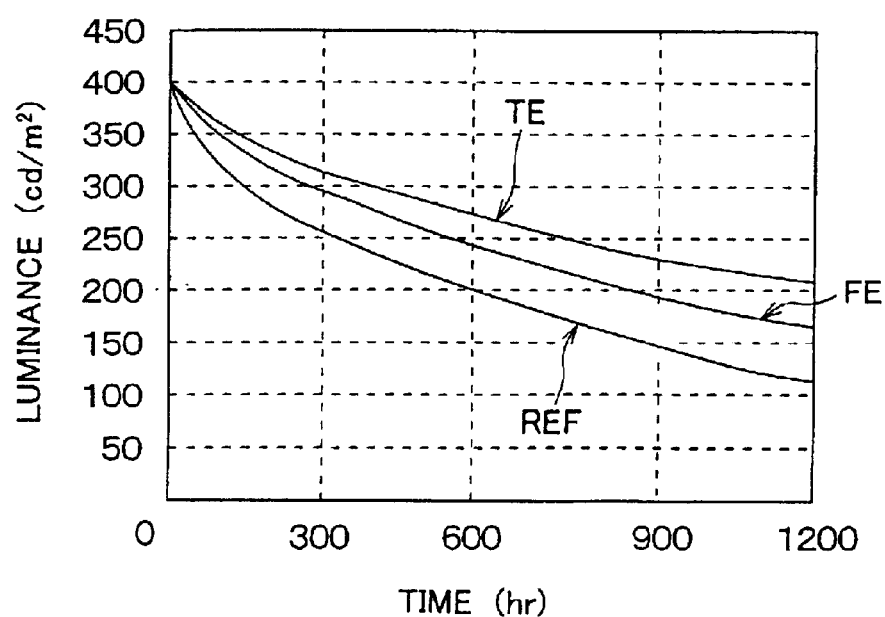
FIG. 6 is a graph showing the correlation between luminance and time with respect to the first example device of the organic EL device according to the first embodiment and an example device of the organic EL device according to the third embodiment.

FIG. 6 shows evaluation results in durability at 85° C. in terms of deterioration in luminance. In FIG. 6, curves FE and REF show the correlation between luminance and time with respect to the first example device of the organic EL device S1 and a reference EL device, which is disclosed in JP-A-2000-182768 and has a hole transport layer including a guest fluorescent dye to prevent the excitation of the host organic material of the hole transport layer. Incidentally, in FIG. 6, a curve TE shows the correlation between luminance and time with respect to a first example device of the device according to a third embodiment, which will be described later.

Figure 7:
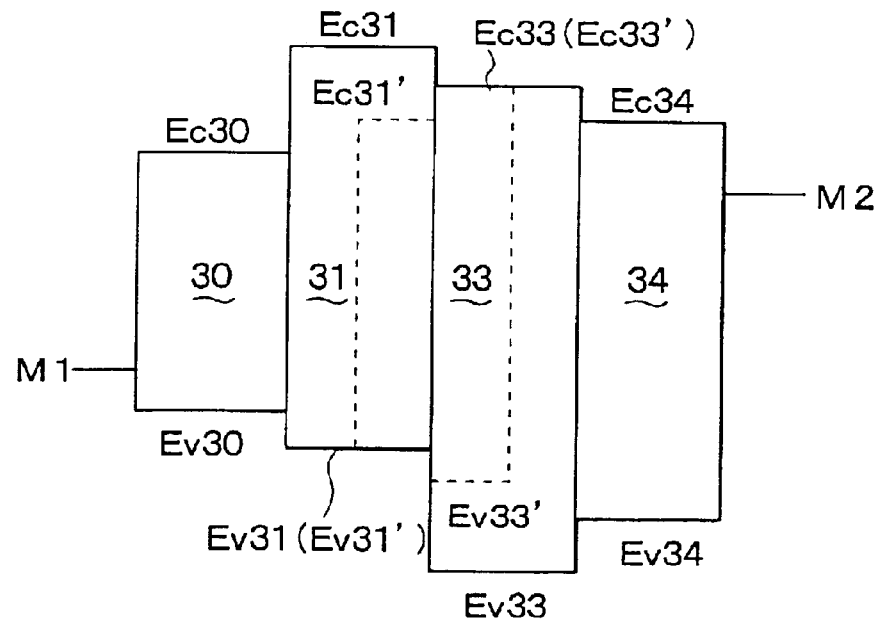
FIG. 7 is the energy band chart of the organic layers in a reference EL device for the first example device of the organic EL device according to the first embodiment.

The reference EL device, the organic layers of which have the relation in energy band shown in FIG. 7, is different from the first example device of the organic EL device S1 in the respect that the reference device does not include the electron capture layer 32 and the hole transport layer 31 of the reference device includes 4-dicyanomethylene-2-methyl-6-(p-dimethylaminostyryl)-4H-pyran (DCM1) as a guest fluorescent dye. The highest energy level Ev31' in the valence band of DCM1 is 5.4 ev. The lowest energy level Ec31' in the conduction band of DCM1 is 3.5 eV. Therefore, the energy gap of DCM1 is 1.9 eV. The luminescent spectrum of DCM1 has a peak between 570 nm and 610 nm. The hole transport layer 31 includes DCM1 at a concentration of approximately 0.25%.

As shown in FIG. 6, the first example device of the organic EL device S1 has a longer life in terms of luminance than the reference device because the electron capture layer 32 prevents electrons from being injected into the hole transport layer 31 in the first example device.

A second example device of the organic EL device S1 according to the first embodiment includes two electron capture layers 32. Each electron capture layer 32 includes a guest fluorescent dye that has a different luminescent color. Specifically, a first electron capture layers 32a includes rubrene, and a second electron capture layers 32b includes dimethylquinacridone. When the second example device of the organic EL device S1 operates, rubrene emits light, the luminescent spectrum of which has a peak at approximately 555 nm, dimethylquinacridone emits light, the luminescent spectrum of which has a peak at approximately 535 nm, and at the same time, perylene included in the luminescent layer 33 emits blue light, the luminescent spectrum of which has a peak at approximately 450 nm. As a result, the second example device of the organic EL device S1 emits white light.

The second example device of the organic EL device S1 is manufactured as follows. Firstly, the anode 20 made of ITO and having a thickness of approximately 150 nm, the hole injection layer 30 made of copper phthalocyanine and having a thickness of approximately 20 nm, and the hole transport layer 31 made of triphenylamine tetramer and having a thickness of approximately 40 nm are sequentially formed on a glass substrate 10, as in the manufacturing process of the first example device of the organic EL device S1.

Subsequently, a first electron capture layer 32a, which includes Alq as a host organic material and rubrene as a guest fluorescent dye, is formed on the hole transport layer 31 by a thickness of approximately 10 nm using high-vacuum thermal sublimation technique. The first electron capture layer 32a includes rubrene at a concentration of approximately 5%. The highest energy level Ev32a' in the valence band of rubrene is 5.4 eV. The lowest energy level Ec32a' in the conduction band of rubrene is 3.2 eV. Therefore, the energy gap of rubrene is 2.2 eV. The luminescent spectrum of rubrene has a peak at approximately 555 nm.

Then, a second electron capture layer 32b, which includes Alq as a host organic material and dimethylquinacridone as a guest fluorescent dye, is formed on the first electron capture layer 32a by a thickness of approximately 2 nm using high-vacuum thermal sublimation technique. The second electron capture layer 32b includes dimethylquinacridone at a concentration of approximately 2%. The highest energy level Ev32b' in the valence band of dimethylquinacridone is 5.5 eV. The lowest energy level Ec32b' in the conduction band of dimethylquinacridone is 3.2 eV. Therefore, the energy gap of dimethylquinacridone is 2.3 eV. The luminescent spectrum of dimethylquinacridone has a peak at approximately 535 nm.

Next, the luminescent layer 33, which includes BAlq as a host organic material and perylene as a guest fluorescent dye, is formed on the second electron capture layer 32b by a thickness of approximately 40 nm. The luminescent layer 33 includes perylene at a concentration of approximately 1%. Then, the electron transport layer 34 is formed by depositing Alq by a thickness of approximately 20. Finally, the cathode 40, which is a stack of a lithium fluoride (LiF) film and an aluminum film, is formed, as in the manufacturing process of the first example device of the organic EL device S1.

Figure 8:
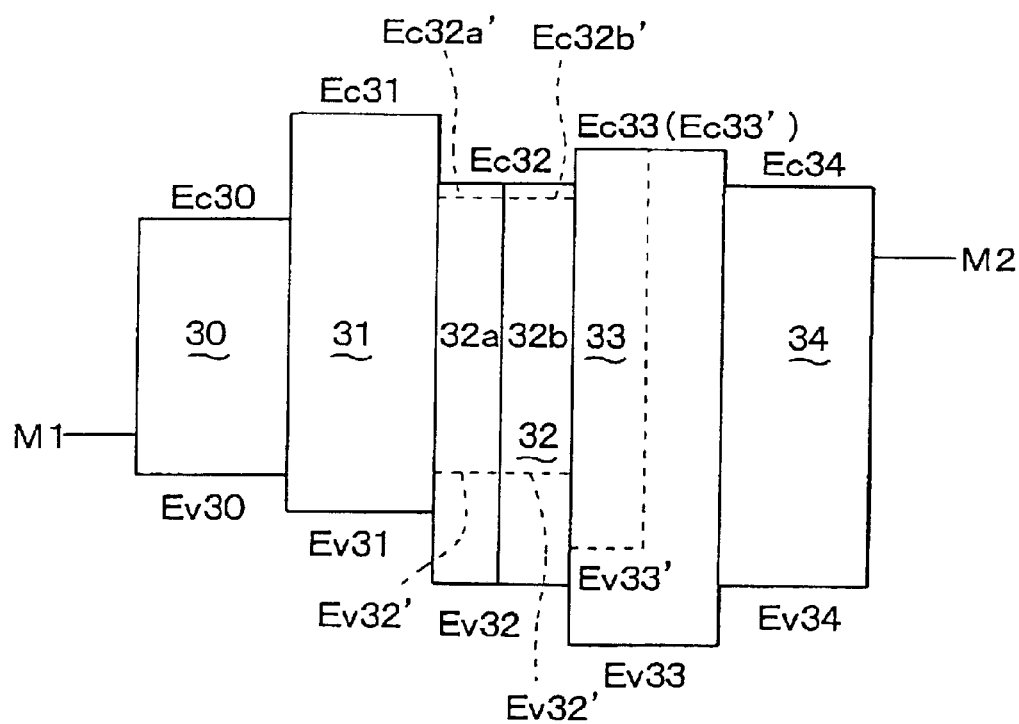
FIG. 8 is the energy band chart of the organic layers in a second example device of the organic EL device according to the first embodiment.

As shown in FIG. 8, the lowest energy level Ec32 (3.1 eV) in the conduction band of Alq, which is the host organic material of the electron capture layers 32a, 32b, is lower than the lowest energy level Ec31 (2.4 eV) in the conduction band of triphenylamine tetramer, which is the host organic material of the hole transport layer 31, and the lowest energy level Ec33 (3.0 eV) in the conduction band of BAlq, which is the host organic material of the luminescent layer 33. Although not shown, evaluation in durability at 85° C. in terms of deterioration in luminance proved that the second example device of the organic EL device S1 has a longer life than the reference device.

The materials described above are not the only ones that can be used for the hole transport layer 31, the electron capture layer 32, and the luminescent layer 33. Other than triphenylamine tetramer, N,N'-diphenyl-N,N'-bis(3-methylphenyl)-1,1'-biphenyl4,4'-diamine (TPD), α-naphthylphenyldiamine (α-NPD), and so on may be used as the host organic material of the hole transport layer 31. Almq3, Znq2, Beq2, and so on may be used as the host organic material of the electron capture layer 32, other than Alq. Pentacene derivatives, coumarin derivatives, and so on may be used as the guest fluorescent dye of the electron capture layer 32, other than DCJTB, rubrene, and dimethylquinacridone. Adamantane derivatives, diphenylanthracene, spirocompounds, benzoxadiazol zinc complex, and so on may be used as the host organic material of the luminescent layer 33, other than BAlq. Distyrylarylene and so on may be used as the guest fluorescent dye of the luminescent layer 33, other than perylene.

Second Embodiment

Figure 9:
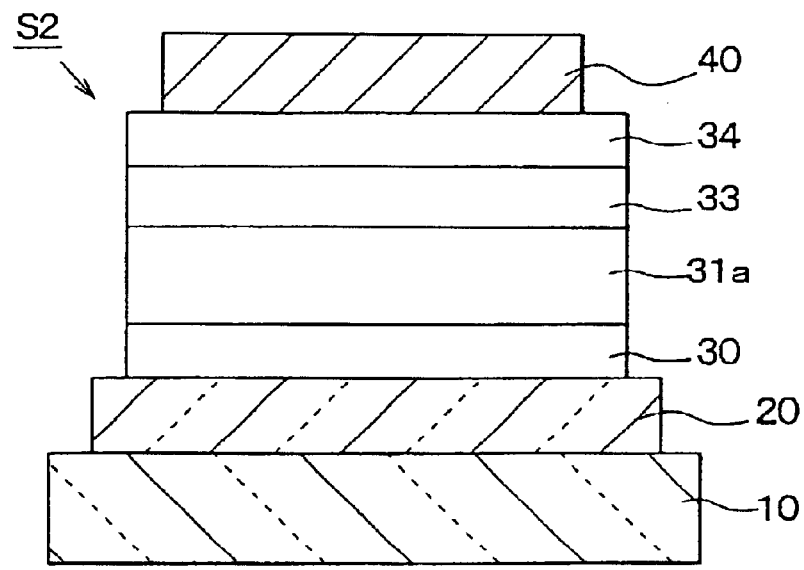
FIG. 9 is a schematic cross-sectional view of the organic EL device according to a second embodiment of the present invention.

As shown in FIG. 9, an organic EL device S2 according to a second embodiment includes a substrate 10, an anode 20, a cathode 40, and a plurality of organic layers 30, 31a, 33, 34. Each electrode 20, 40 is made of a transparent conductive film, and the organic layers 30, 31a, 33, 34 are located between the electrodes 20, 40. The electrodes 20, 40 and the organic layers 30, 31a, 33, 34 are located on the substrate 10. The organic layers 30, 31a, 33, 34 are a hole injection layer 30, a hole transport layer 31a, a luminescent layer 33, and an electron transport layer 34. The four organic layers 30, 31a, 33, 34 are sequentially stuck in the above order between the anode 20 and the cathode 40 in the direction toward the cathode 40. The organic EL device S2 according to a second embodiment has no electron capture layer 32, which is included in the organic EL device S1 shown in FIG. 1. Instead, the hole transport layer 31a has the same function as the electron capture layer 32.

The luminescent layer 33 includes a host organic material, which emits blue light, and a guest fluorescent dye. The hole transport layer 31a include a host organic material, which transports holes, and a dopant such as copper phthalocyanine, which is not fluorescent and has the lowest energy level Ec31a' in the conduction band lower than that of the host organic material of the luminescent layer 33.

Figure 10:
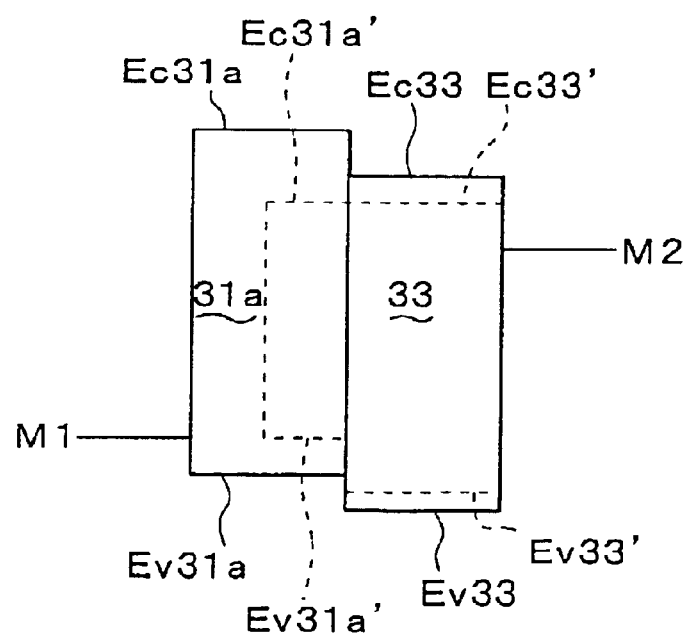
FIG. 10 is a typical energy band chart of the hole transport layer and the luminescent layer in the organic EL device according to the second embodiment.

In the organic EL device S2 in FIG. 9, the hole transport layer 31a and the luminescent layer 33 have the relation in energy band shown in FIG. 10. In FIG. 10, M1 and M2 denote the work functions of the anode 20 and the cathode 40, respectively. Energy levels Ec31a and Ec32 are the lowest energy levels in the conduction bands of the host organic materials of the hole transport layer 31a and the luminescent layer 33, respectively. Energy levels Ev31a and Ev33 are the highest energy levels in the valence bands of the host organic materials of the hole transport layer 31a and the luminescent layer 33, respectively. Energy levels Ec31a' and Ev31a' are the lowest energy level in the conduction band and the highest energy level in the valence band of the dopant, which is included in the hole transport layer 31a. Energy levels Ec33' and Ev33' are the lowest energy level in the conduction band and the highest energy level in the valence band of the guest fluorescent dye, which is included in the luminescent layer 33. As shown in FIG. 10, the energy level Ec31a' of the hole transport layer 31a is lower than the energy level Ec33 of the luminescent layer 33.

The host organic material of the luminescent layer 33 has a wide energy gap to emit blue light, and the energy gap is so wide that it is possible to add the guest fluorescent dye, which emits blue light, to the luminescent layer 33. By adding the guest fluorescent dye to the luminescent layer 33, it is possible to permit the luminescent layer 33 to emit blue light if the dopant of the hole transport layer 31a has a relatively narrow energy gap for the purpose of satisfying the above-described relation between the energy levels Ec31a' and Ec33. Electrons injected from the cathode 40 are trapped by the guest fluorescent dye in the luminescent layer 33, and holes injected from the anode 20 drain into the guest fluorescent dye of the luminescent layer 33. Electrons trapped by the guest fluorescent dye and holes recombine to permit guest fluorescent dye to emit blue light in the luminescent layer 33.

As described, the hole transport layer 31a includes the dopant, which is not fluorescent and the lowest energy level Ec31a40 of which is lower than that of the host organic material of the luminescent layer 33. Therefore, electrons, which are injected from the cathode 40 into the luminescent layer 33 and drain into the hole transport layer 31a, are captured by the dopant. Thus, the dopant prevents electrons from being injected to the host organic material of the hole transport layer 31a, and prevents the host organic material from being excited by electrons. As a result, the organic EL device S2 according to a second embodiment preferably efficiently and stably emits blue light while the host organic material of the hole transport layer 31a is prevented from deteriorating.

An example device of the organic EL device S2 according to the second embodiment includes copper phthalocyanine as the dopant in the hole transport layer 31a and perylene as the guest fluorescent dye in the luminescent layer 33. When the example device operates, perylene included in the luminescent layer 33 emits blue light, the luminescent spectrum of which has a peak at approximately 450 nm. Therefore, the example device of the organic EL device S2 emits blue light. The example device is manufactured as follows. Firstly, the anode 20 made of ITO and having a thickness of approximately 150 nm and the hole injection layer 30 made of copper phthalocyanine and having a thickness of approximately 20 nm are sequentially formed on a glass substrate 10, as in the manufacturing process of the first example device of the organic EL device S1.

Then, a first partial layer of the hole transport layer 31a is formed on the hole injection layer 30 by depositing triphenylamine tetramer by a thickness of approximately 30 nm using high-vacuum thermal sublimation technique. The highest energy level Ev31a in the valence band of triphenylamine tetramer is 5.4 eV. The lowest energy level Ec31a in the conduction band of triphenylamine tetramer is 2.4 eV. Therefore, the energy gap of triphenylamine tetramer is 3.0 eV. The luminescent spectrum of triphenylamine tetramer has a peak at approximately 420 nm.

Next, a second partial layer of the hole transport layer 31a, which includes triphenylamine tetramer as the host organic material and copper phthalocyanine as the dopant, is formed on the first partial layer by a thickness of approximately 10 nm using high-vacuum thermal sublimation technique. The second partial layer includes copper phthalocyanine at a concentration of approximately 10%. The highest energy level Ev31a' in the valence band of copper phthalocyanine is 5.3 eV. The lowest energy level Ec31a' in the conduction band of copper phthalocyanine is 3.6 eV. Therefore, the energy gap of copper phthalocyanine is 1.7 eV.

Subsequently, the luminescent layer 33, which includes BAlq as a host organic material and perylene as a guest fluorescent dye, is formed on the hole transport layer 31 by a thickness of approximately 40 nm using high-vacuum thermal sublimation technique. The luminescent layer 33 includes perylene at a concentration of approximately 1%. The highest energy level Ev33 in the valence band of BAlq is 5.8 eV. The lowest energy level Ec33 in the conduction band of BAlq is 3.0 eV. Therefore, the energy gap of Alq is 2.8 eV. The luminescent spectrum of BAlq has a peak at approximately 490 nm. The highest energy level Ev33' in the valence band of perylene is 5.5 eV. The lowest energy level Ec33' in the conduction band of perylene is 2.6 eV. Therefore, the energy gap of perylene is 2.9 eV. The luminescent spectrum of perylene has a peak at approximately 450 nm. Then, the electron transport layer 34 is formed by depositing Alq by a thickness of approximately 20 nm. Finally, the cathode 40, which is a stack of a LiF film and an aluminum film, is formed, as in the manufacturing process of the first example device of the organic EL device S1.

Figure 11:
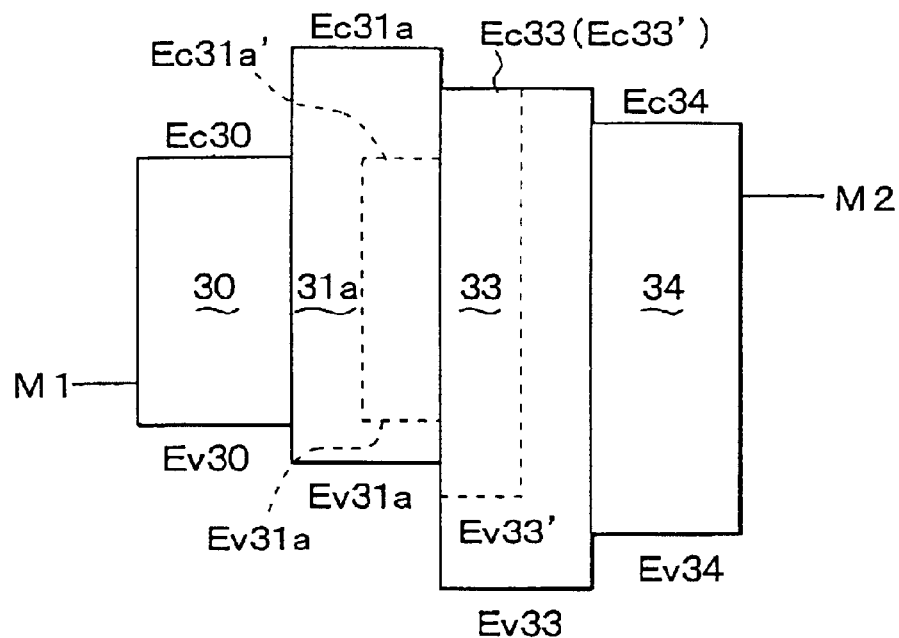
FIG. 11 is the energy band chart of the organic layers in an example device of the organic EL device according to the second embodiment.

As shown in FIG. 11, the lowest energy level Ec31a' (3.6 eV) in the conduction band of copper phthalocyanine, which is the dopant of the hole transport layer 31a, is lower than the lowest energy level Ec33 (3.0 eV) in the conduction band of BAlq, which is the host organic material of the luminescent layer 33.

Figure 12:
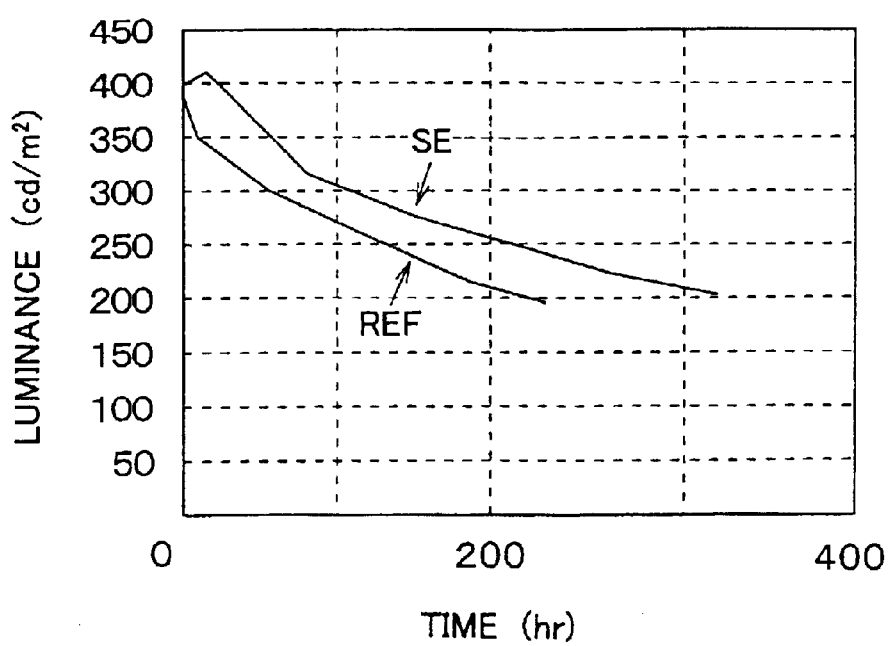
FIG. 12 is a graph showing the correlation between luminance and time with respect to the example device of the organic EL device according to the second embodiment.

FIG. 12 shows evaluation results in durability at 85° C. in terms of deterioration in luminance. In FIG. 12, curves SE and REF respectively show the correlation between luminance and time with respect to the example device of the second embodiment and the correlation between luminance and time with respect to a reference EL device, which has the same structure as the example device, except that the hole transport layer 31a does not include copper phthalocyanine as the dopant. As shown in FIG. 12, the example device of the organic EL device S2 has a longer life in terms of luminance than the reference device, because the dopant prevents electrons from being injected to the host organic material of the hole transport layer 31a and prevents the host organic material from being excited by electrons, and as a result, the host organic material of the hole transport layer 31a is prevented from deteriorating.

The materials described in the first embodiment can also be used for the hole transport layer 31a and the luminescent layer 33. In addition, oxadiazol compounds and so on may be used as the dopant of the hole transport layer 31a, other than copper phthalocyanine.

Third Embodiment

Figure 13:
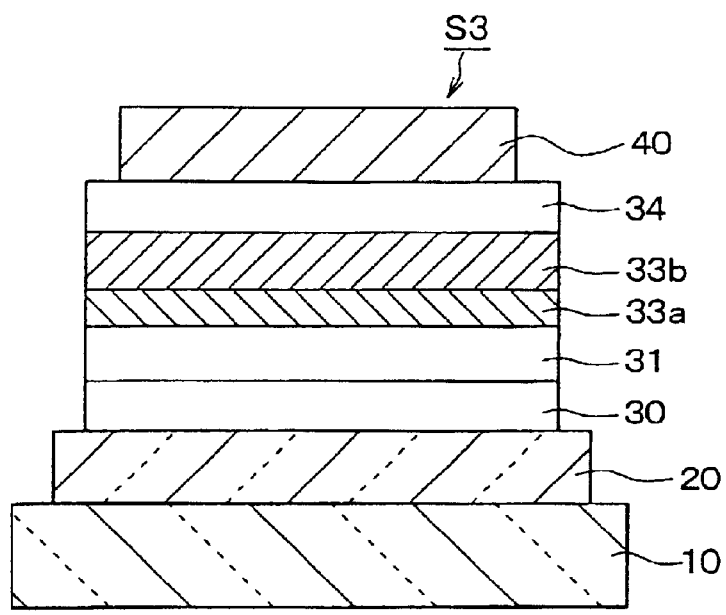
FIG. 13 is a schematic cross-sectional view of the organic EL device according to a third embodiment of the present invention.

As shown in FIG. 13, an organic EL device S3 according to a third embodiment includes a substrate 10, an anode 20, a cathode 40, and a plurality of organic layers 30, 31, 33a, 33b, 34. Each electrode 20, 40 is made of a transparent conductive film, and the organic layers 30, 31, 33a, 33b, 34 are located between the electrodes 20, 40. The electrodes 20, 40 and the organic layers 30,31, 33a, 33b, 34 are located on the substrate 10. The organic layers 30, 31, 33a, 33b, 34 are a hole injection layer 30, a hole transport layer 31, a first luminescent layer 33a, a second luminescent layer 33b, and an electron transport layer 34. The five organic layers 30, 31, 33a, 33b, 34 are sequentially stuck in the above order between the anode 20 and the cathode 40 in the direction toward the cathode 40.

Each luminescent layer 33a, 33b includes a host organic material and a guest fluorescent dye. The host organic material of the second luminescent layer 33b includes a first electron transport material, which transports electrons, and the luminescent spectrum of which has a peak between 380 nm and 510 nm so that the first electron transport material emits blue light. The host organic material of the first luminescent layer 33a includes a hole transport material and a second electron transport material. The hole transport material transports holes, and has a luminescent spectrum that has a peak between 380 nm and 510 nm so that the hole transport material emits blue light. The second electron transport material transports electrons, and the lowest energy level in the conduction band of the second electron transport material is lower than that of the first electron transport material.

As shown in FIG. 13, the electron transport layer 34 and the cathode 40 are sequentially formed on the luminescent layers 33a, 33b. Each layer of the organic EL device S3 according to a third embodiment is formed by depositing a single material or by depositing simultaneously a plurality of materials using high-vacuum thermal sublimation technique, as described later.

The host organic material of the second luminescent layer 33b, which includes the first electron transport material, has a wide energy gap to emit blue light, and the energy gap is so wide that it is possible to add the guest fluorescent dye, which emits blue light, to the second luminescent layer 33b. By adding the guest fluorescent dye to the second luminescent layer 33b, it is possible to permit the second luminescent layer 33b to emit efficiently blue light with the following mechanism. Electrons injected from the cathode 40 are trapped by the guest fluorescent dye in the second luminescent layer 33b, and holes injected from the anode 20 drain into the guest fluorescent dye of the second luminescent layer 33b through the hole injection layer 30, the hole transport layer 31, and the hole transport material in the first luminescent layer 33a. Electrons trapped by the guest fluorescent dye and holes recombine to permit the guest fluorescent dye to emit blue light in the second luminescent layer 33b.

On the other hand, the first luminescent layer 33a emits light with the following mechanism. Electrons injected from the cathode 40 drain into the first luminescent layer 33a through the electron transport layer 34 and the first electron transport material in the second luminescent layer 33b, and holes injected from the anode 20 drain into the first luminescent layer 33a through the hole injection layer 30 and the hole transport layer 31. Electrons and holes injected into the first luminescent layer 33a are respectively dispersed in the second electron transport material and the hole transport material in the first luminescent layer 33a. Due to the dispersion, electrons and holes recombine in the entire region of the first luminescent layer 33a to permit the guest fluorescent dye to emit efficiently light. As a result, the organic EL device S3 according to the third embodiment emits mixed light having the colors of the lights emitted from the first luminescent layer 33a and the second luminescent layer 33b.

In the organic EL device S3 according to the third embodiment, the lowest energy level in the conduction band of the second electron transport material, which is the host organic material of the first luminescent layer 33a, is lower than that of the first electron transport material, which is the host organic material of the second luminescent layer 33b. Therefore, electrons injected from the cathode 40 into the first luminescent layer 33a through the second luminescent layer 33b are trapped by the second electron transport material. The difference in the lowest energy level between the first and second electron transport materials is preferably greater than 0.1 eV.

If the first electron transport material and the second electron transport material were the same, in other words, if the lowest energy levels in the conduction bands of the first and second electron transport materials were the same, electrons injected from the cathode 40 into the first luminescent layer 33a through the second luminescent layer 33b would not be trapped by the second electron transport material and readily drained into the hole transport layer 31.

Electrons trapped by the second electron transport material are consumed in light emission of the guest fluorescent dye in the first luminescent layer 33a, as described above, so electrons injected from the cathode 40 is prevented from draining into the hole transport layer 31. Therefore, the host organic material of the hole transport layer 31 is prevented from being excited by electrons. As a result, the organic EL device S3 according to the third embodiment preferably efficiently and stably emits light including blue color while the host organic material of the hole transport layer 31 is prevented from deteriorating. In addition, the organic EL device S3 according to the third embodiment can emit light having a variety of mixed color because different guest fluorescent dyes in the first and second luminescent layers 33a, 33b permit each layer 33a, 33b to emit light having a different color.

An example device of the organic EL device S3 according to the third embodiment includes DCJTB as the guest fluorescent dye in the first luminescent layer 33a. The first example device also includes perylene as the guest fluorescent dye in the second luminescent layer 33b. When the example device of the organic EL device S3 operates, DCJTB emits red light, the luminescent spectrum of which has a peak at approximately 600 nm, and at the same time, perylene emits blue light, the luminescent spectrum of which has a peak at approximately 450 nm. As a result, the example device of the organic EL device S3 emits white light.

The example device of the organic EL device S3 according to the third embodiment is manufactured as follows. Firstly, the anode 20 made of ITO and having a thickness of approximately 150 nm and the hole injection layer 30 made of copper phthalocyanine and having a thickness of approximately 20 nm are sequentially formed on a glass substrate 10, as in the manufacturing process of the first example device of the organic EL device S1.

Then, the hole transport layer 31 is formed on the hole injection layer 30 by depositing triphenylamine tetramer by a thickness of approximately 40 nm using high-vacuum thermal sublimation technique. The highest energy level Ev31 in the valence band of triphenylamine tetramer is 5.4 eV. The lowest energy level Ec31 in the conduction band of triphenylamine tetramer is 2.4 eV. Therefore, the energy gap of triphenylamine tetramer is 3.0 eV. The luminescent spectrum of triphenylamine tetramer has a peak at approximately 420 nm.

Next, the first luminescent layer 33a, which includes triphenylamine tetramer as the hole transport material, Alq as the second electron transport material, and DCJTB as the guest fluorescent dye, is formed on the hole transport layer 31 by a thickness of approximately 5 nm by depositing simultaneously the materials using high-vacuum thermal sublimation technique. The concentration of triphenylamine tetramer and that of Alq in the first luminescent layer 33a are the same. The first luminescent layer 33a includes DCJTB at a concentration of approximately 1%.

The highest energy level Ev33a in the valence band of triphenylamine tetramer is 5.4 eV. The lowest energy level Ec33a in the conduction band of triphenylamine tetramer is 2.4 eV. The highest energy level Ev33a' in the valence band of Alq is 5.6 eV. The lowest energy level Ec33a' in the conduction band of Alq is 3.1 eV. The highest energy level Ev33a" in the valence band of DCJTB is 5.3 eV. The lowest energy level Ec33a" in the conduction band of DCJTB is 3.2 eV. Therefore, the energy gap of DCJTB is 2.1 eV. The luminescent spectrum of DCJTB has a peak at approximately 600 nm.

Subsequently, the second luminescent layer 33b, which includes BAlq as the first electron transport material and perylene as the guest fluorescent dye, is formed on the first luminescent layer 33a by a thickness of approximately 40 nm by depositing simultaneously the materials using high-vacuum thermal sublimation technique. The luminescent layer 33 includes perylene at a concentration of approximately 1%. The highest energy level Ev33b in the valence band of BAlq is 5.8 eV. The lowest energy level Ec33b in the conduction band of BAlq is 3.0 eV. Therefore, the energy gap of Alq is 2.8 eV. The luminescent spectrum of BAlq has a peak at approximately 490 nm. The highest energy level Ev33b' in the valence band of perylene is 5.5 eV. The lowest energy level Ec33b' in the conduction band of perylene is 2.6 eV. Therefore, the energy gap of perylene is 2.9 eV. The luminescent spectrum of perylene has a peak at approximately 450 nm. Then, the electron transport layer 34 is formed by depositing Alq by a thickness of approximately 20 nm. Finally, the cathode 40, which is a stack of a LiF film and an aluminum film, is formed, as in the manufacturing process of the first example device of the organic EL device S1.

Figure 14:
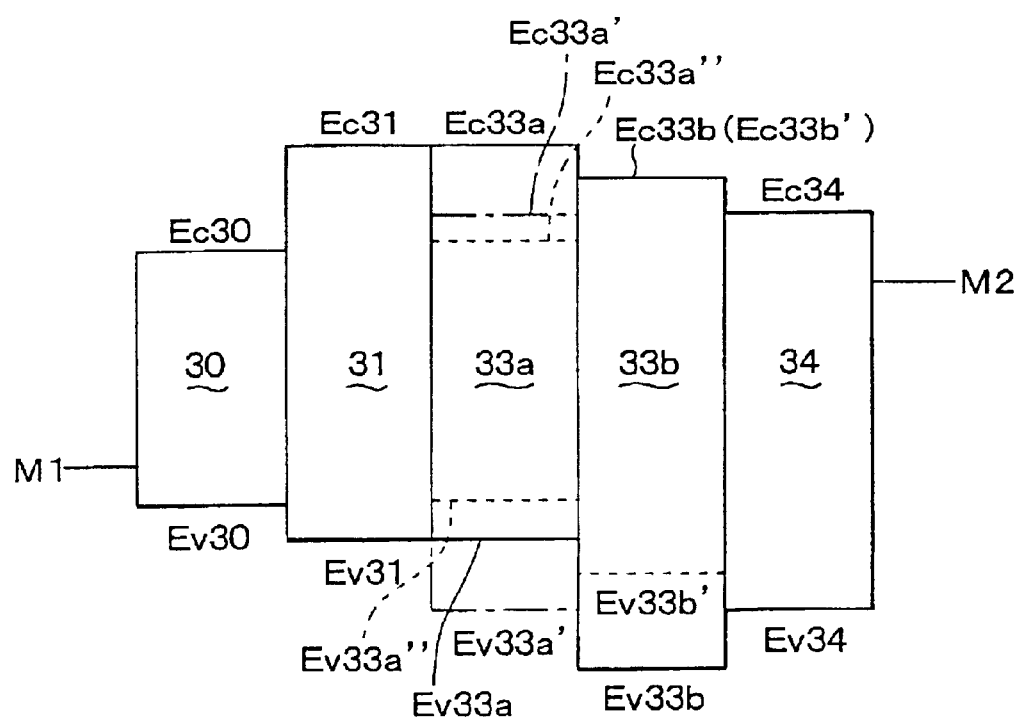
FIG. 14 is an energy band chart of the organic layers in an ample device of the organic EL device according to the third embodiment.

As shown in FIG. 14, the lowest energy level Ec33a' (3.1 eV) in the conduction band of Alq, which is the second electron transport material in the first luminescent layer 33a, is lower by 0.1 eV than the lowest energy level Ec33b (3.0 eV) in the conduction band of BAlq, which is the first electron transport material in the second luminescent layer 33b. In FIG. 14, M1 and M2 denote the work functions of the anode 20 and the cathode 40, respectively.

As shown in FIG. 6, the example device of the organic EL device S3 has a longer life in terms of luminance than the first example device of the organic EL device S1 because the first luminescent layer 33a (5 nm) of the example device of the organic EL device S3 is thicker than the electron capture layer 32 (2 nm) of the first example device of the organic EL device S1. The thicker the layer that is adjacent to the hole transport layer 31 and has a capability of trapping electrons, the more efficiently electrons are trapped.

The first luminescent layer 33a can be thicker than the electron capture layer 32 because the first luminescent layer 33a includes the hole transport material and the second electron transport material, so electrons and holes are sufficiently transported in the first luminescent layer 33a. If the host organic material of the first luminescent layer 33a included only the hole transport material, electrons would not be efficiently transported in the first luminescent layer 33a. Therefore, when the first luminescent layer 33a is thickened, only the guest fluorescent dye located in the proximity of the boundary between the first luminescent layer 33a and the second luminescent layer 33b emits light.

That means that less electrons would be trapped by the second electron transport material and consumed in light emission of the guest fluorescent dye in the first luminescent layer 33a, so electrons injected from the cathode 40 would not be preferably prevented from draining into the hole transport layer 31. Therefore, the host organic material of the hole transport layer 31 would not be preferably prevented from being excited by electrons. As a result, the host organic material of the hole transport layer 31 would not be preferably prevented from deteriorating.

In the organic EL device S3 according to a third embodiment, it is preferred that the highest energy level Ev33a' in the valence band of the second electron transport material be lower than the highest energy level Ev33a in the valence band of the hole transport material in the host organic material of the first luminescent layer 33a in order to permit the first and second luminescent layers 33a, 33b to proportionally emit light. In the example device of the organic EL device S3 according to the third embodiment, the highest energy level Ev33a in the valence band of triphenylamine tetramer, which is the hole transport material, is 5.4 eV and the highest energy level Ev33a' in the valence band of Alq, which is the second electron transport material, is 5.6 eV. Therefore, the example device of the organic EL device S3 satisfies the above relation in energy level.

If the highest energy level Ev33a' in the valence band of the second electron transport material was higher than the highest energy level Ev33a in the valence band of the hole transport material, holes that otherwise drain into the second luminescent layer 33b from the first luminescent layer 33a would be trapped by the second electron transport material. As a result, the light emission of the second luminescent layer 33b would be insufficient.

Other than BAlq, adamantine derivatives, pyrene compounds, and so on may be used as the first electron transport material in the second luminescent layer 33b, which emits blue light. Moreover, the materials that can be used for the host organic materials and the guest fluorescent dyes of the first and second luminescent layers 33a, 33b are not limited to the ones described above. Other materials may be used as long as the materials satisfy the relation in energy band shown in FIG 14. In addition, the guest fluorescent dyes of the first and second luminescent layers 33a, 33b may be the same, although the first and second luminescent layers 33a, 33b emit light having the same color.

What is claimed is:

1. An organic electroluminescent device comprising: an anode;
   a cathode;
   a hole transport layer;
   an electron capture Layer; and
   a luminescent layer, which includes a host organic material, the luminescent spectrum of which has a peak between 380 ram and 510 nm, and a guest fluorescent dye, wherein the hole transport layer, the electron capture layer, and the luminescent layer are sequentially stuck in this order between the anode and the cathode in the direction toward the cathode.

2. The organic electroluminescent device in claim 1, wherein the hole transport layer and the electron capture layer respectively include a host organic material, and the lowest energy level in the conduction band of the host organic material of the electron capture layer is lower than those of the host organic material of the hole transport layer and the host organic material of the luminescent layer.

3. The organic electroluminescent device in claim 2, whereon the electron capture layer includes a quest fluorescent dye.

4. The organic electroluminescent device in claim 3, wherein the energy gap of the guest fluorescent dye of the electron capture layer is smaller than that of the host organic material of the electron capture layer.

5. The organic electroluminescent device in claim 2, wherein the difference in energy gap between the host organic material of the hole transport layer and the host organic material of the luminescent layer is smaller than 0.4 eV.

6. The organic electroluminescent device in claim 2, wherein the lowest energy level in the conduction band of the host organic material of the electron capture layer is lower than that of the luminescent layer by more than 0.1 eV.

7. The organic electroluminescent device in claim 2, wherein the hole transport layer is thinner than the luminescent layer.

8. The organic electroluminescent device in claim 2, wherein the energy gap of the guest fluorescent dye of the luminescent layer is smaller than that of the host organic material of the luminescent layer.

9. The organic electroluminescent device in claim 1, wherein the hole transport layer includes a host organic material, the luminescent spectrum of which has a peak between 380 nm and 510 nm.

10. An organic electroluminescent device comprising:
    an anode;
    a cathode;
    a hole transport layer, which includes a dopant that is not fluorescent; and
    a luminescent layer, which includes a host organic material, the luminescent spectrum of which has a peak between 380 nm and 510 nm, and a guest fluorescent dye, wherein the hole transport layer and the luminescent layer are sequentially stuck in this order between the anode and the cathode in the direction toward the cathode, and wherein the lowest energy level in the conduction band of the dopant is lower than that of the host organic material of the luminescent layer.

11. The organic electroluminescent device in claim 10, wherein the dopant is copper phthalocyanine.

12. An organic electroluminescent device comprising:
    an anode;
    a cathode;
    a hole transport layer;
    a first luminescent layer, which includes a guest fluorescent dye and a host organic material; and
    a second luminescent layer, which includes a guest fluorescent dye and a host organic material, wherein the host organic material of the second luminescent layer includes a first electron transport material, wherein the luminescent spectrum of the host organic material of the second luminescent layer has a peak between 380 nm and 510 nm, wherein the hole transport layer, the first luminescent layer, and the second luminescent layer are sequentially stuck in this order between the anode and the cathode in the direction toward the cathode, wherein the host organic material of the first luminescent layer includes a hole transport material and a second electron transport material, wherein the hole transport material has a luminescent spectrum that has a peak between 380 nm and 510 nm, and wherein the lowest energy level in the conduction band of the second electron transport material is lower than that of the first electron transport material.

13. The organic electroluminescent device in claim 12, wherein the lowest energy level in the conduction band of the second electron transport material is lower than that of the first electron transport material by more than 0.1 eV.

14. The organic electroluminescent device in claim 12, wherein the highest energy level in the valence band of the second electron transport material is lower than that of the hole transport material.

* * * * *